(12) United States Patent
Nagao et al.

(10) Patent No.: US 9,365,950 B2
(45) Date of Patent: Jun. 14, 2016

(54) CRYSTALLIZER AND METHOD OF CRYSTALLIZATION

(71) Applicant: Nagao System Inc., Kawasaki-shi (JP)

(72) Inventors: Fumiyoshi Nagao, Kawasaki (JP); Daisuke Nagao, Kawasaki (JP)

(73) Assignee: Nagao System Inc., Kawasaki-shi (JP)

(*) Notice: Subject to any disclaimer, the term of this patent is extended or adjusted under 35 U.S.C. 154(b) by 0 days.

(21) Appl. No.: 14/728,486

(22) Filed: Jun. 2, 2015

(65) Prior Publication Data

US 2015/0354091 A1    Dec. 10, 2015

(30) Foreign Application Priority Data

Jun. 5, 2014    (JP) .................................. 2014-116454

(51) Int. Cl.
*C30B 7/08* (2006.01)
*C30B 30/08* (2006.01)

(52) U.S. Cl.
CPC . *C30B 30/08* (2013.01); *C30B 7/08* (2013.01); *Y10T 117/1024* (2015.01)

(58) Field of Classification Search
CPC .......... C30B 7/00; C30B 7/08; Y10S 117/901
See application file for complete search history.

(56) References Cited

U.S. PATENT DOCUMENTS

| 5,139,605 A * | 8/1992 | Littke ....................... C30B 7/00 117/70 |
| 7,402,208 B2 * | 7/2008 | Sanjoh ....................... C30B 7/00 117/200 |

FOREIGN PATENT DOCUMENTS

| JP | 2002-316899 | 10/2002 |
| JP | 2003-290602 | 10/2003 |
| JP | 2008-273276 | 11/2008 |
| JP | 2011-110535 | 6/2011 |
| JP | 2012-55860 | 3/2012 |
| JP | 2012-176331 | 9/2012 |

OTHER PUBLICATIONS

Office Action issued Jul. 23, 2014, in corresponding Japanese Patent Application No. 2014-116454 (w/ English Translation), 6 pages.

* cited by examiner

*Primary Examiner* — Robert M Kunemund
(74) *Attorney, Agent, or Firm* — Oblon, McClelland, Maier & Neustadt, L.L.P.

(57) ABSTRACT

To provide a crystallizer to generate pseudo non-gravity environment by three-dimensional high speed rotation and to minimize influence of gravity in crystallization process for crystallizing a substance from a solution. The crystallizer has turning gear, container 9, and container supporting unit 30. The turning gear includes horizontal shafts 3,6, first rotation frame 1 coupled to first shafts, motor 4 rotating frame 1 about X-X line, vertical shafts 7,8 provided on frame 1, and driving force transmission system 10. System 10 includes first disc 11 and second disc 12. First disc 11 rotates relative to frame 1 about axis of shafts 6. Second disc 12 is coupled to shaft 7. Contact between disc 11 and disc 12 transmits a turning force of frame 1 rotated by motor 4 to cause frame 2 to rotate about Y-Y line.

16 Claims, 14 Drawing Sheets

CRYSTALLIZER AND METHOD OF CRYSTALLIZATION

CROSS-REFERENCE TO RELATED APPLICATIONS

The present application claims priority to Japanese Patent Application No. JP2014-116454, filed Jun. 5, 2014, the entire content and disclosure of which is incorporated by reference herein.

BACKGROUND OF THE INVENTION

1. Field of the Invention

The present invention relates to a crystallizer capable of obtaining high quality crystals under pseudo non-gravity environment.

2. Description of the Related Art

Nowadays, various experiments are conducted in the International Space Station (ISS). Specifically, experiments utilizing peculiarity of the non-gravity environment are conducted. For example, even a substance which is hardly crystallized due to an influence of gravity on the earth can be crystallized under non-gravity environment. The non-gravity environment may bring out a possibility of creation of a brand new substance. It is expected that the new substance is effective for development of new drug for treating incurable disease.

For example, a crystal having isotropy can be obtained under non-gravity environment. A bar-shaped crystal and a plate-shaped crystal are fragile, whereas an isotropic crystal is stable. Further, owing to the isotropy, each of the isotropic crystals comes to have a uniform grain diameter and grain shape. This allows the isotropic crystals to dissolve at the same timing. Therefore, the isotropic crystals can be delivered to a target position in a human body. If a favorable result can be obtained in the experiments, production of the isotropic crystals in space will be considered in the future.

However, it is difficult to conduct the experiments frequently in space since there is a limit in time and cost when considering an access to the space and frequency of conducting the experiments. Specifically, in the current idea stage in study, a large amount of budget cannot be expected and thus the experiments in the ISS cannot be realized.

An apparatus which simulates microgravity environment in a laboratory on the earth is proposed (see, for example, Patent Literature 1 or Patent Literature 2). The apparatus enables conduct of experiments similar to those conducted in the ISS. Also, if repetition of preliminary experiments by the apparatus can bring significant data, conducting experiments in the ISS may be positively considered.

A microgravity generator normally includes two rotators, i.e., a first rotator and a second rotator provided within the first rotator.

The first rotator rotates about an axial center of a first shaft oriented in a horizontal direction. The first shaft is coupled to an output shaft of a first electric motor and is rotatably driven by the first electric motor. Accordingly, the first rotator rotates about the axial center of the first shaft extending in the horizontal direction.

The second rotator rotates about an axial center of a second shaft oriented in a vertical direction. The second shaft is oriented in a direction perpendicular to the first shaft. The second shaft is coupled to an output shaft of a second electric motor and rotatably driven by the second electric motor. Accordingly, the second rotator rotates about the axial center of the second shaft extending in the vertical direction.

The microgravity generator is three-dimensionally rotated about the axial centers of the two shafts crossing at a right angle to thereby continuously change a gravity direction. The change of gravity direction before a substance to be crystallized receives gravity stimulus enables dispersion of a gravity vector. This minimizes an influence of gravity. Accordingly, the microgravity generator realizes the microgravity environment.

CITATION LIST

Patent Literatures

[Patent Literature 1] Japanese Unexamined Patent Application, First Publication No. 2003-290602

[Patent Literature 2] Japanese Unexamined Patent Application, First Publication No. 2002-316899

SUMMARY OF THE INVENTION

Technical Problem

In the conventional microgravity generator, a second electric motor also rotates about an axial center of a first shaft in association with rotation of a first rotator. As a result, the second electric motor receives a large force (centrifugal force), and thus might be damaged if the first rotator is rotated at high speed (e.g., 60 rpm).

Therefore, the speed of rotation needed to be limited to a value equal to or less than several tens of rpm (e.g., 20 rpm). As a result, a satisfactory effect could not be produced although the influence of gravity could be decreased. In other words, it was impossible to produce an effect similar to the effect produced under non-gravity environment in the ISS.

The present invention was made to solve the above described problem. More specifically, a purpose of the present invention is to provide a crystallizer capable of obtaining high quality crystals under pseudo non-gravity environment generated by three-dimensional high speed rotation.

Solution to Problem

A crystallizer of the present invention which solves the above described problem includes a turning gear, a container, and a container supporting unit for supporting the container within a range of the turning gear.

The turning gear includes:
first shafts;
a first rotator coupled to the first shafts;
a drive unit causing the first rotator to rotate about an axial center formed by the first shafts;
second shafts provided on the first rotator, the second shafts having an axial center formed by the second shafts, the axial center oriented to a direction perpendicular to the direction of the axial center of the first shafts;
a second rotator coupled to the second shafts; and
a driving force transmission system.

The driving force transmission system includes:
a first disc rotating about the axial center of the first shafts relative to the first rotator, the first disc having its disc face oriented to a direction perpendicular to the first shafts; and
a second disc coupled to one of the second shafts, the second disc having its disc face oriented to a direction perpendicular to the second shafts;
wherein a contact between the first disc and the second disc transmits a turning force of the first rotator which is rotated by the drive unit to cause the second rotator to rotate about the axial center of the second shafts.

A crystallizer of the present invention which solves the above described problem includes a turning gear, a container, and a container supporting unit for supporting the container within a range of the turning gear.

The turning gear includes:
first shafts;
a first rotator coupled to the first shafts;
a drive unit rotating the first rotator about an axial center formed by the first shafts;
second shafts provided on the first rotator, the second shafts having an axial center formed by the second shafts, the axial center oriented to a direction perpendicular to the direction of the axial center of the first shafts; and
a driving force transmission system.

The driving force transmission system includes:
a first disc rotating about the axial center of the first shafts relative to the first rotator, the first disc having its disc face oriented to a direction perpendicular to the first shafts; and
a second disc coupled to one of the second shafts, the second disc having its disc face oriented to a direction perpendicular to the second shafts;
wherein a contact between the first disc and the second disc transmits a turning force of the first rotator which is rotated by the drive unit to cause the second shafts to rotate about the axial center of the second shafts.

The second motor is not essential because the rotation about the axial center of the second shafts is performed via the driving force transmission system. As a result, a pseudo non-gravity environment can be generated at a rotation center according to high speed rotation. The isotropy of crystal growth improves.

Further, the three-dimensional rotation causes a solution within the container to flow and thermally diffuse. This makes a temperature of the solution uniform. The isotropy of crystal growth improves also in this regard.

The container of the present invention has a spherical shape.

When the solution within the container flows in association with the three-dimensional rotation, an influence caused by the container shape is limitative. The isotropy of crystal growth can be maintained.

The present invention further includes a heat exchange unit for changing a temperature of the container.

Effective crystallization is performed by the heat exchange unit.

The present invention further includes the heat exchange unit. The container has a spherical shape. The heat exchange unit is covered by a spherical heat medium cover. The heat exchange unit causes the temperature of the container to change by using a heating medium (including cooling medium) which covers the container.

Coverage of the spherical container by the heating medium ensures effective and secure heat exchange.

The container supporting unit of the present invention supports the container via the heat medium cover.

The three-dimensional rotation causes also the heating medium to flow and thermally diffuse. As a result, the temperature of the heating medium becomes uniform. Therefore, a uniform heat exchange can be realized. The isotropy of crystal growth improves.

Further, the container supporting unit eases support and removal of the container.

The heat exchange unit of the present invention includes a heating medium channel which guides the heating medium into the heat medium cover from the external heat medium supply unit via conduits formed within one of the first shafts, the first rotator, and the second shafts.

The heating medium channel ensures continuous supply of the heating medium. In other words, crystallization can be continued without cooling suppression.

The present invention further includes a temperature control unit.

The temperature control unit
estimates a temperature of the inside of the container based on a supply side temperature and a discharge side temperature of the heating medium channel, and thereby
controls a temperature of a heating medium supplied from an external heat medium supply unit in a manner that the estimated temperature becomes a predetermined temperature.

The heating medium channel can control the temperature of the inside of the container. For example, the heating medium channel can realize a temperature history such as rapid cooling and gradual cooling.

The present invention further includes a joint.

There are openings formed in the first rotator at positions where the second shafts are mounted.

Each opening is continuous with the conduit formed within the first rotator.

Each joint is formed by engaging the second shaft with the corresponding opening.

With the joint, the heating medium channel can be secured without obstructing the rotation of the second shafts.

The heat exchange unit of the present invention is switchable between cooling and heating.

Generally, the crystallization is performed by cooling; however, depending on a substance, the crystallization may be performed by heating. The present invention can work also in the latter case.

The crystallization also can be performed by thermal dissolution and the subsequent cooling. During the crystallization, speed of rotation can be changed. In other words, the present invention can work in various situations.

The present invention which solves the above problem is a method of crystallization by using the above described crystallizer.

According to the method, while the container is rotated by the turning gear, the heat exchange unit is switched from heating to cooling. More specifically, the container is heated for dissolution, whereas the container is cooled for crystallization.

A vast amount of substance is dissolved by means of dissolution at high temperature and the three-dimensional rotation. Use of the supersaturated solution obtained by rapidly decreasing the temperature of the solution in this state ensures obtainment of many crystals. In other words, a continuous and highly effective crystallization operation can be performed.

At the time, the speed of rotation may be changed but the rotation is never stopped. Processes from the dissolution to the crystallization can be performed as a series of operations. Therefore, good operability can be achieved.

Advantageous Effect of Invention

The crystallizer of the present invention can realize a pseudo non-gravity condition at a rotation center according to three-dimensional high speed rotation. This can minimize influence of gravity in crystallization process for crystallizing a substance from a solution.

DESCRIPTION OF THE EMBODIMENTS

First Embodiment
Configuration

Figure 1:
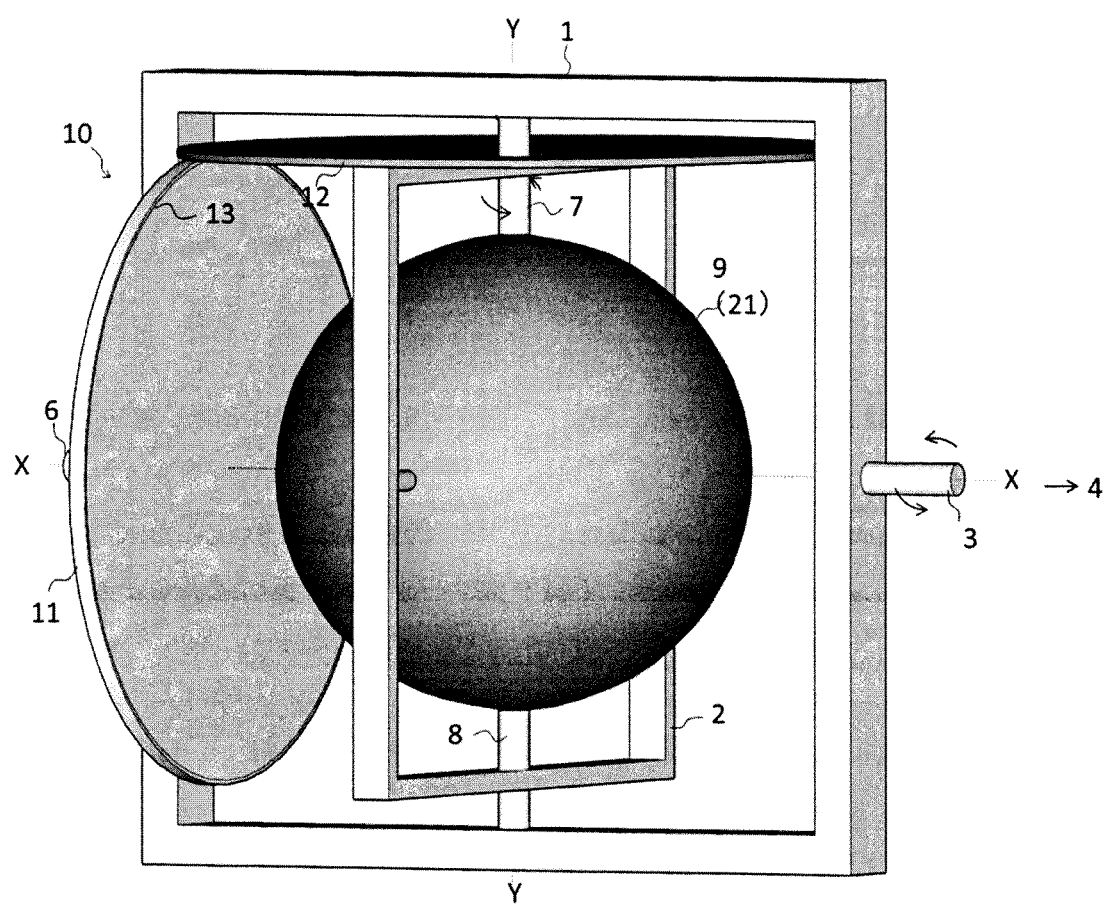
FIG. 1 is a schematic perspective view of a crystallizer according to a first embodiment.

A configuration of the first embodiment will be described below. FIG. 1 is a schematic perspective view of a crystallizer according to a first embodiment. For the sake of easy understanding, only main components are illustrated. Meanwhile, components omitted from FIG. 1 can be referred to in FIG. 7 which illustrates a similar configuration.

The crystallizer includes a turning gear for rotating a first rotation frame 1 and a second rotation frame 2 provided inside the first rotation frame.

The first rotation frame 1 is coupled to a horizontal shaft (first shaft) 3. The horizontal shaft 3 is coupled to an output shaft of an electric motor 4 via a belt. The first rotation frame 1 rotates about an axial center of the horizontal shaft 3 (about an X-X line as an axial center) by the driving force of the electric motor 4. The electric motor 4 is mounted to a fixed frame 5.

Meanwhile, a horizontal shaft (first shaft) 6 is provided to the first rotation frame 1 on an opposite side of the horizontal shaft 3. A ball bearing is provided between the horizontal shaft 6 and the first rotation frame 1. Therefore, the horizontal shaft 6 is immovable even while the first rotation frame 1 rotates.

The second rotation frame 2 is positioned inside the first rotation frame 1. The second rotation frame 2 is coupled to vertically oriented shafts (vertical shafts: second shafts) 7 and 8. Each of the shafts 7 and 8 is positioned at a center position in a right-left and rear-front direction of the first rotation frame 1 in a manner as illustrated.

A ball bearing is provided between each of the vertical shafts 7 and 8 and the first rotation frame 1, respectively. Therefore, even while the second rotation frame 2 (and the vertical shafts 7 and 8) rotates about an axial center of the vertical shafts 7 and 8 (about a Y-Y line as an axial center), the turning force thereof is not transmitted to the first rotation frame 1.

A spherical container 9 is positioned inside the second rotation frame 2 via the vertical shafts 7 and 8. For the sake of a stable support of the container, coupling rods 31 are bridged between the spherical container 9 and the second rotation frame 2. A solution to be subjected to a crystallization operation is held within the spherical container 9. A center of the spherical container 9 corresponds to a rotation center of the turning gear.

The turning gear includes a driving force transmission system 10. The driving force transmission system 10 is composed of a first disc 11, a second disc 12, and an elastic body 13.

A first disc 11 is coupled to the horizontal shaft 6, with its disc face being oriented to a direction perpendicular to the horizontal shaft 6. A second disc 12 is coupled to the second rotation frame 2 and the vertical shaft 7, with its disc face being oriented to a direction perpendicular to the vertical shaft 7. Further, the first disc 11 and the second disc 12 are positioned in a manner that a peripheral surface of the first disc 11 contacts an outer periphery of the disc face of the second disc 12.

Further, the peripheral surface of the first disc 11 or/and the outer periphery of the disc face of the second disc 12, i.e., a contact surface of at least one of the first disc 11 and the second disc 12, is provided with an elastic body (e.g., rubber) 13 having a large friction coefficient. In a case of the first disc 11, the rubber to be provided on the peripheral surface of the first disc 11 is a rubber band. In a case of the second disc 12, the rubber to be provided on the second disc 12 is a circular shaped sheet rubber. With the rubber, the peripheral surface of the first disc 11 is brought into a press-contact with the second disc 12 via the rubber 13. Thereby, a frictional force is generated between the first disc 11 and the second disc 12.

When the electric motor 4 is driven, the first rotation frame 1 rotates about the X-X line via the horizontal shaft 3.

At the time, since the horizontal shaft 6 on the opposite side of the horizontal shaft 3 is kinetically unconnected with the first rotation frame 1, the driving force of the electric motor 4 does not directly work to rotate the first disc 11.

To the contrary, the vertical shafts 7 and 8 provided on the first rotation frame 1 also rotate about the X-X line in association with the rotation of the first rotation frame 1. Further, the second rotation frame 2 and the second disc 12 also rotate similarly about the X-X line via the vertical shafts 7 and 8.

The first disc 11 and the second disc 12 are in a press-contact state. The rotation of the second disc 12 about the X-X line causes the first disc 11 to indirectly rotate about the X-X line via the frictional force between the second disc 12 and the first disc 11. In other words, the first disc 11 rotates relative to the first rotation frame 1.

The rotation of the first disc 11 about the X-X line causes the second disc 12 to rotate about the axial center of the vertical shafts 7 and 8 (about the Y-Y line) via the frictional force between the first disc 11 and the second disc 12. The second rotation frame 2 also rotates about the Y-Y line.

In other words, the second rotation frame 2 rotates about an axial center of the horizontal axes 3 and 6 (about the X-X line) as well as also rotates about the axial center of the vertical shafts 7 and 8 (about the Y-Y line).

The spherical container 9 is supported inside the second rotation frame 2 via the vertical shafts 7 and 8 and the coupling rods 31. The spherical container 9 also rotates about the X-X line as well as rotates about the Y-Y line. More specifically, the spherical container 9 performs biaxial rotation (three-dimensional rotation).

When the electric motor 4 is rotated at high speed, a pseudo non-gravity environment appears at a center of the inside of the spherical container 9. Meanwhile, the pseudo non-gravity environment theoretically appears only at the center of the inside of the spherical container 9; however, a certain range of area around the center may be practically considered as being under pseudo non-gravity environment. The same applies hereafter.

Operation

An operation of the crystallizer according to the first embodiment will be described below.

Initially, a solution containing a substance to be crystallized is injected into the spherical container 9 via a filler port (not shown). A coupling 32 is provided between the spherical container 9 and each of the vertical shafts 7 and 8 and between the spherical container 9 and each of the coupling rods 31, respectively. The spherical container 9 is supported within a range of the turning gear via the couplings 32.

The spherical container 9 is biaxially rotated, i.e., rotated about the X-X line as well as the Y-Y line, by the turning gear. Accordingly, a pseudo non-gravity environment appears at around the center of the inside of the spherical container 9.

Air cooling means (not shown) supplies cool air to the spherical container 9. This lowers the temperature of the inside of the spherical container 9 as well as lowers solubility of the solution. As a result, crystallization begins.

The crystallization is generally performed by cooling. However, in a case of a substance which is crystallized by temperature elevation, warm current of air is sent to the substance. Hereinafter, a description will be made provided that the crystallization is performed by cooling.

Because the crystallization is performed under the condition of pseudo non-gravity environment, crystals grow isotropically.

After the lapse of a prescribed time, the turning gear is stopped, and the couplings 32 are released. Then, the spherical container 9 is removed from the turning gear.

Thus crystallized substance is taken out from the solution within the spherical container 9.

Effect

In the conventional art, high speed rotation could not be performed since a second motor itself mounted to a second rotation frame was rotated. As a result, it was impossible to realize the pseudo non-gravity environment.

To the contrary, the second motor is not essential since the second rotation frame 2 is rotated by the driving force transmission system 10 in the present embodiment. Without the second motor, the pseudo non-gravity environment can be generated at around the center of the container 9 by high speed rotation.

As a result, isotropy of crystal growth improves.

Meanwhile, in the present embodiment, it is possible to perform the high speed rotation (e.g., rotation at or beyond 60 rpm). However, as a matter of course, the speed can be changed. According to a content of target operation, also, low speed rotation (e.g., rotation at about 20 rpm) can be employed.

Further, in the conventional art, a test tube-shaped container or a rectangular shaped container is employed. With the container having such shape, a solution within the container flows by biaxial rotation (three-dimensional rotation); however, the flow may drift due to the container shape, resulting in occurrence of degradation of isotropy of crystal growth.

To the contrary, according to the present embodiment, the spherical container 9 is employed. When the solution within the container flows in association with the biaxial rotation, influence of the container shape is limitative, and the isotropy of crystal growth can be kept. In other words, better isotropy can be achieved in comparison with the conventional art.

Further, the solution flows by the three-dimensional rotation of the spherical container 9 to be thermally diffused. This makes the temperature of the solution more uniform, resulting in improvement of isotropy of crystal growth.

Application to Two Liquids Mixed-Type Solution

In the above description, a non-mixed type liquid is employed as the solution within the container 9. The crystallizer of the present embodiment, however, is applicable also to a crystallization operation for two liquids mixed-type solution.

A solution A and a solution B are injected into the spherical container 9. Then, the spherical container 9 is supported within the range of the turning gear.

The two liquids are mixed uniformly by the three-dimensional rotation of the spherical container 9. Then, crystallization is performed by sending cool air. By the mixture of two liquids, a chemical reaction between liquids occurs prior to the crystallization operation. This ensures a compositional control of the substance to be crystallized or creation of a new substance.

At the time, operations from the mixture to the crystallization can be performed as a series of operations. In other words, good operability can be realized since it is not necessary to stop rotation of the turning gear.

Further, the three-dimensional rotation ensures smooth and uniform mixture.

Second Embodiment

Configuration

A configuration of a second embodiment will be described below. The second embodiment differs from the first embodiment in that the air cooling is employed in the first embodiment, whereas liquid cooling (e.g., water or alcohol is employed as a liquid) is employed in the second embodiment. Further, the second embodiment differs from the first embodiment in that the spherical container 9 is directly supported within the second rotation frame 2 (more precisely, via the vertical shafts 7 and 8 and the coupling rods 31) in the first embodiment, whereas the spherical container is supported via a coolant cover 21 in the second embodiment.

Figure 2:
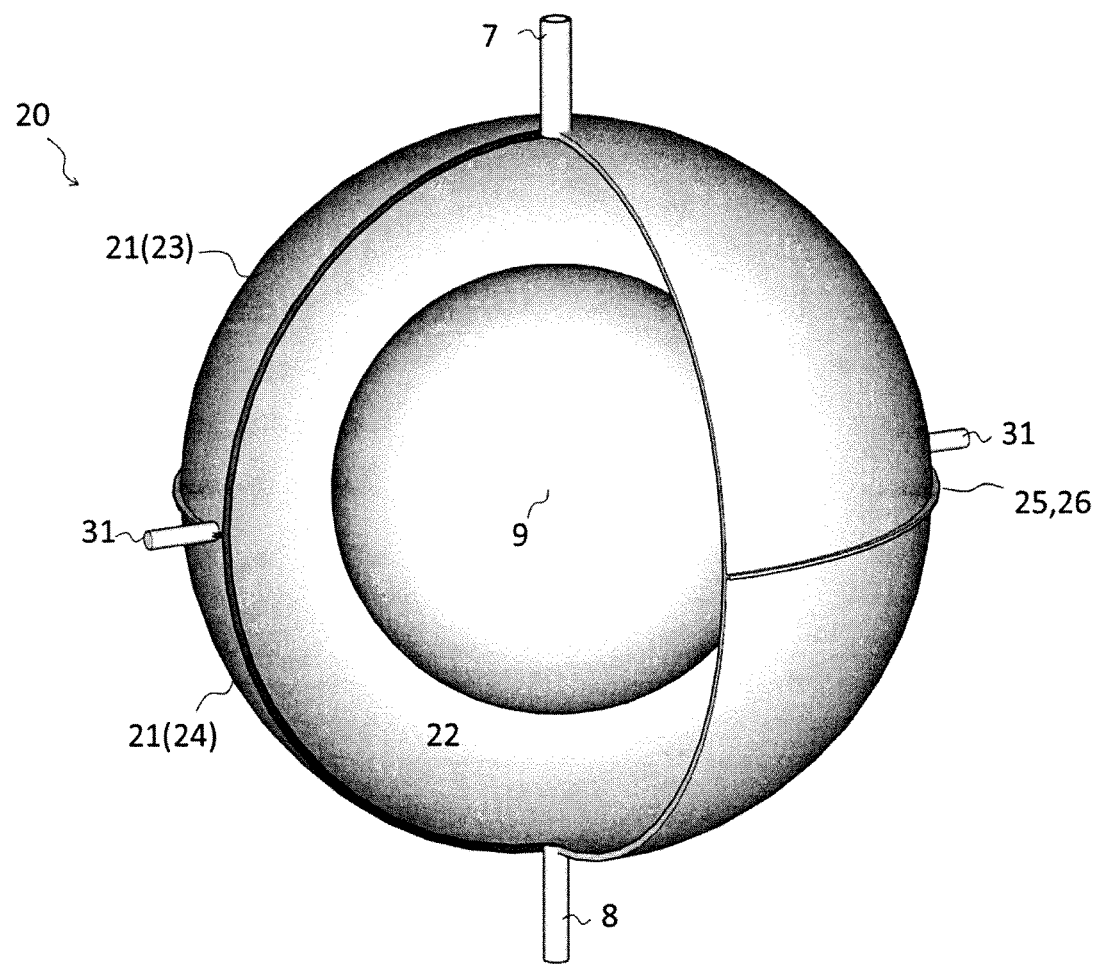
FIG. 2 is a perspective view of a cooling unit according to a second embodiment.

FIG. 2 is a perspective view of a cooling unit 20. For the sake of easy understanding of an inner structure of the cooling unit 20, the perspective view is partially cut out. Further, for the sake of simple illustration, a supporting unit 30 is not illustrated here (see, FIGS. 3 to 6 for the illustration of the supporting unit 30).

The spherical container 9 is covered by the spherical coolant cover 21. Further, the spherical container 9 is supported within the spherical coolant cover 21 (This will be mentioned below). With the structure, a heat exchange space 22 is defined between the spherical container 9 and the coolant cover 21. The coolant cover 21 is provided with a filler port for introducing cooling medium (not shown). When cooling medium is injected into the heat exchange space 22, the cooling medium comes to cover the spherical container 9.

Figure 3:
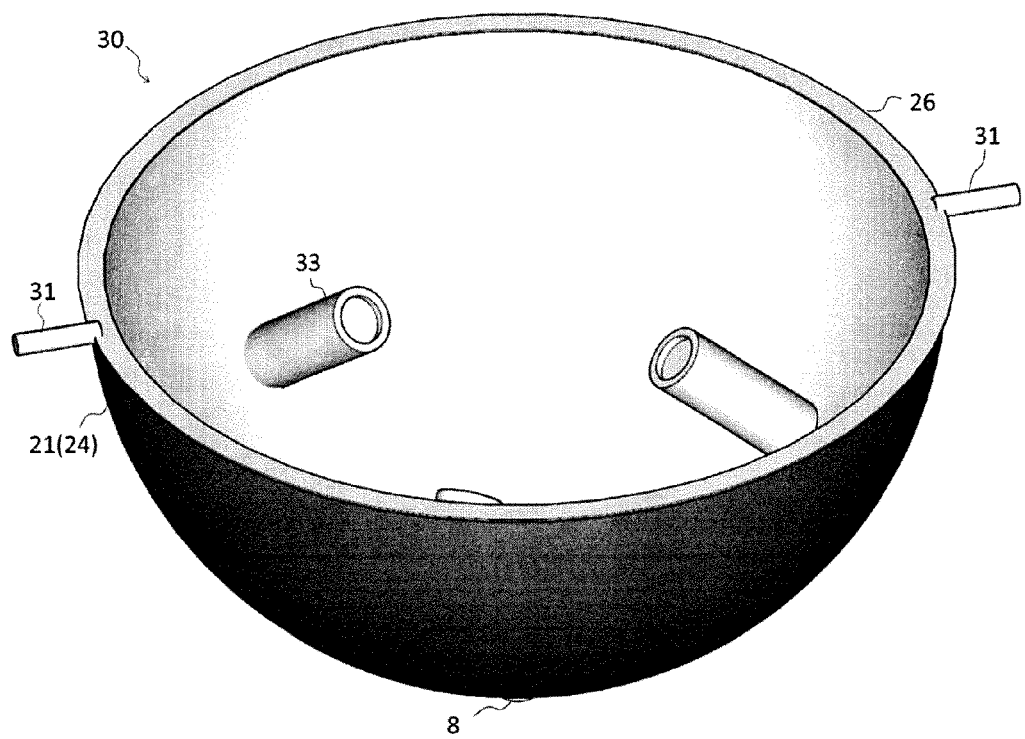
FIG. 3 is a perspective view of a container supporting unit according to the second embodiment.
Figure 4A:
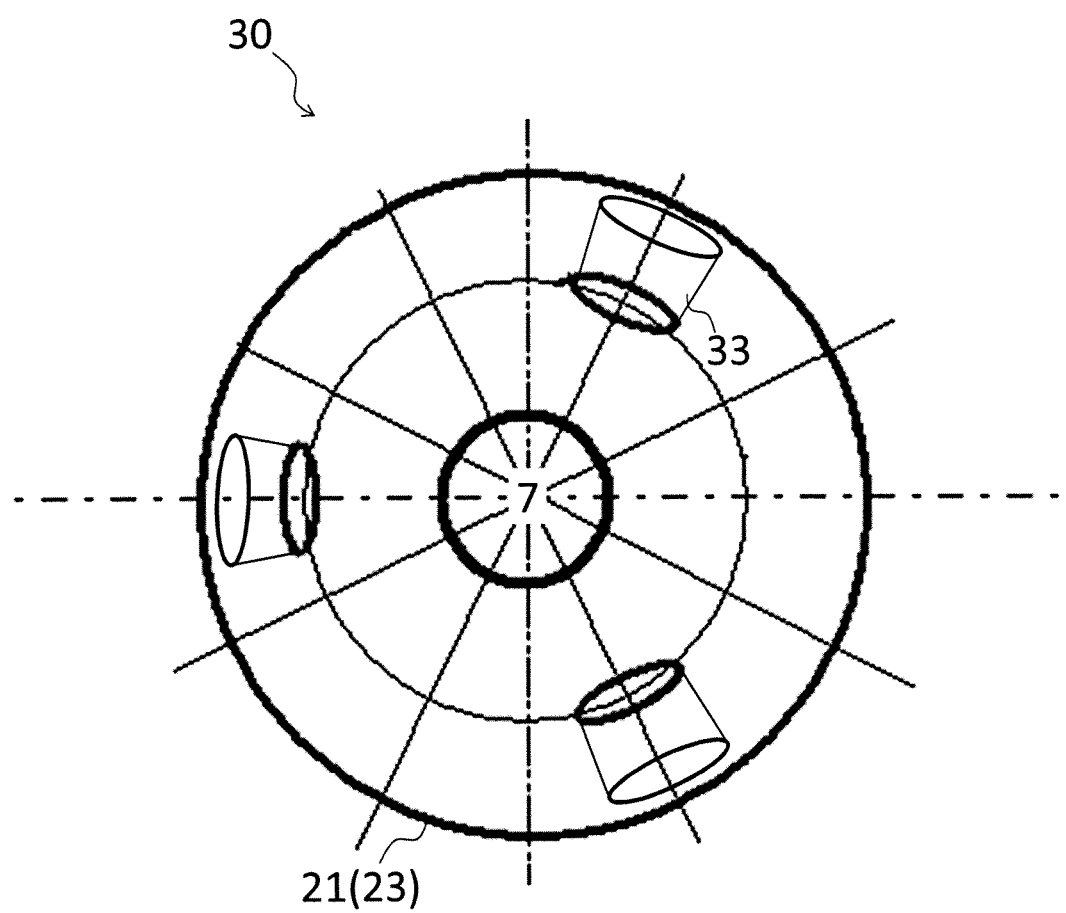
FIG. 4A is a plane view of the container supporting unit according to the second embodiment.
Figure 4B:
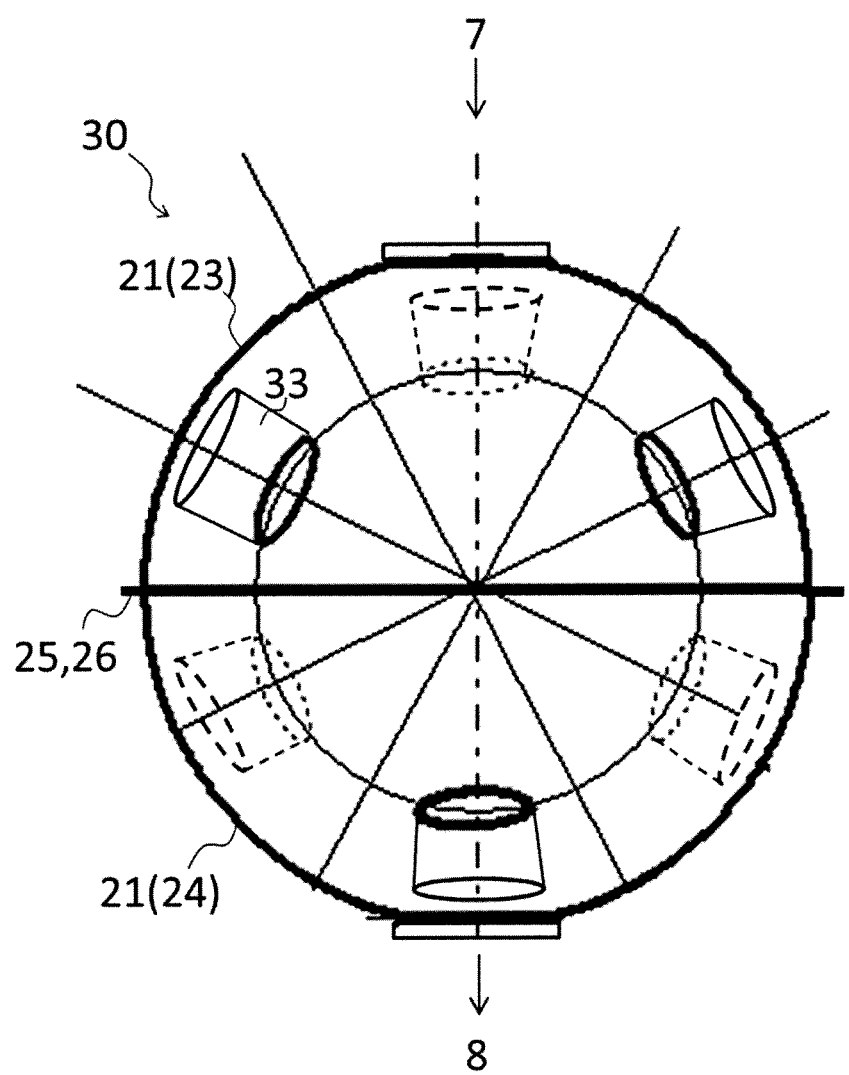
FIG. 4B is a side surface view of the container supporting unit according to the second embodiment.

FIG. 3 is a perspective view of the container supporting unit 30. FIG. 4A is a plan view, and FIG. 4B is a side surface view of the container supporting unit 30. The coolant cover 21 is positioned within a range of the second rotation frame 2 via the vertical shafts 7 and 8 and the coupling rods 31 (see, FIG. 1).

The coolant cover 21 is composed of two half-spheres 23 and 24. The half-spheres 23 and 24 include flanges 25 and 26, respectively. The flanges are overlaid and fixed one another to form the spherical coolant cover 21.

A plurality of supports 33 are planted so as to be oriented to approximately a center direction from an inner wall surface of the lower half-sphere 24. Preferably, the number of supports 33 is three or more. At least more than one (e.g., three) supports 33 are planted also on the upper half-sphere 23.

An end face of each support 33 is processed to be, for example, a ring shape or a concaved surface shape, such that the end face corresponds to the shape of the spherical container 9.

Figure 5:
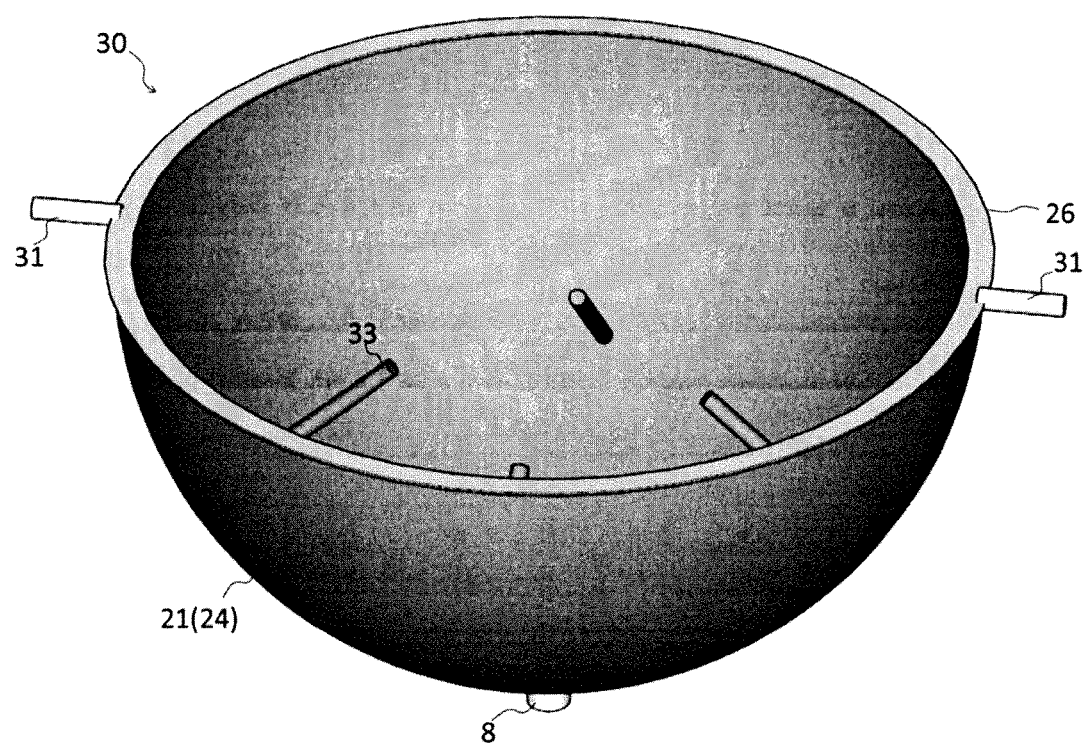
FIG. 5 illustrates an exemplary modification of the container supporting unit according to the second embodiment.

FIG. 5 illustrates an exemplary modification of the container supporting unit 30. Four supports are planted on the lower half-sphere 24. Four supports 33 are also planted on the upper half-sphere 23 at positions corresponding to the supports on the lower half-sphere 24 (not shown).

Operation

Figure 6:
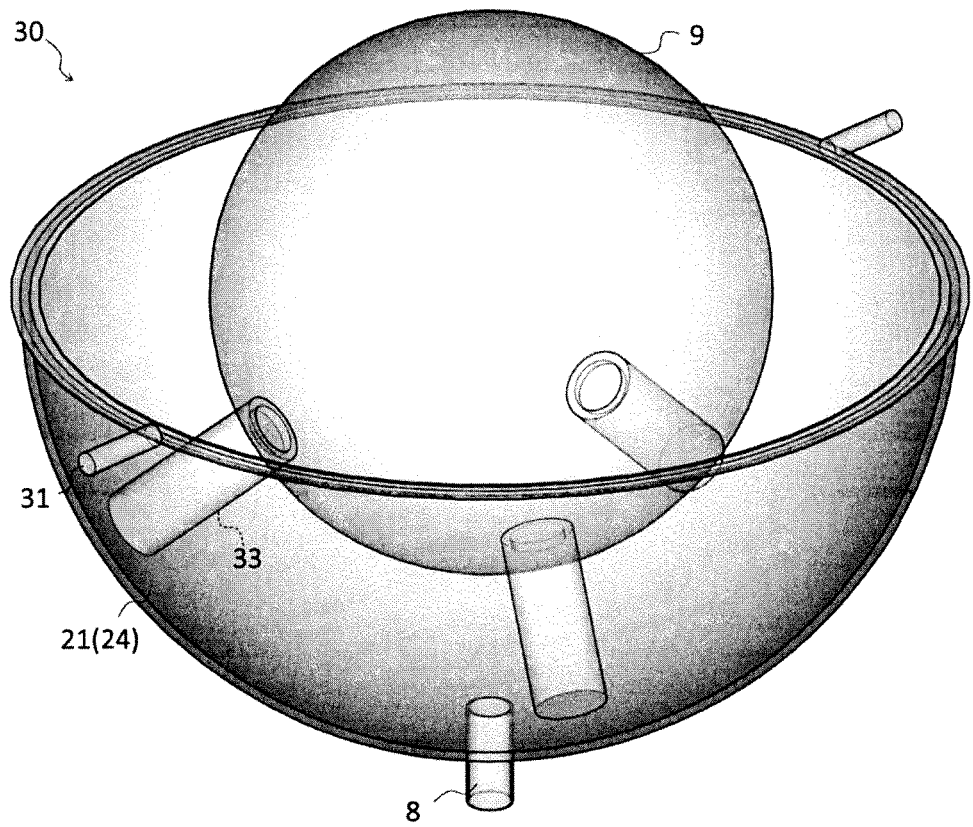
FIG. 6 illustrates a supporting state of the container according to the second embodiment.

An operation of the second embodiment will be described below. FIG. 6 illustrates a supporting operation. For the sake of easy understanding of an inner structure, FIG. 6 is partially cut out.

Initially, a solution containing a substance to be crystallized is injected into the spherical container 9 via a filler port (not shown).

The lower half-sphere 24 is positioned within the second rotation frame 2 in advance via the vertical shaft 8 and the coupling rods 31. In this status, the spherical container 9 is positioned in a manner that the end faces of the supports 33 contact the spherical container 9.

The upper half-sphere 23 is positioned so as to be opposed to the lower half-sphere 24 to form the coolant cover 21. A coupling 32 is provided between the upper half-sphere 23 and the vertical shaft 7. Both are coupled to each other via the coupling 32. Accordingly, the spherical container 9 is securely supported within the range of the turning gear.

A cooling medium is injected into the heat exchange space 22. The temperature of the inside of the spherical container 9 is lowered as well as solubility of the solution is lowered due to heat exchange. As a result, crystallization begins.

The spherical container 9 is rotated about two axes (is rotated about three-dimensionally), i.e., rotated about the X-X line and the Y-Y line, by means of the turning gear. Accordingly, a pseudo non-gravity environment appears at around the center within the spherical container 9.

At the time, the coolant cover 21 also rotates three-dimensionally. The cooling medium also flows and is thermally diffused. This makes the temperature of the cooling medium uniform. In other words, uniform heat exchange is achieved.

Meanwhile, because of being under pseudo non-gravity environment, crystals grow isotropically.

After the lapse of a prescribed time from heat equilibrium, the crystallization ends. The turning gear is stopped.

Release of the couplings 32 allows removal of the upper half-sphere 23. Next, the spherical container 9 supported by the end faces of the supports 33 is removed.

Thus crystallized substance is taken out from the solution within the spherical container 9.

Effect

The cooling unit 20 of the present embodiment has the configuration as set forth above. In addition to the spherical container 9, the coolant cover 21 also rotates three-dimensionally. Therefore, both of the solution and the cooling medium flow as well as are thermally diffused. Accordingly, more uniform heat exchange is achieved. As a result, the isotropy of crystal growth improves more.

In the present embodiment, the spherical container 9 is supported via the coolant cover 21 and the supports 33 (more precisely, the vertical shafts 7 and 8 and the coupling rods 31 also composes the container supporting unit 30). This ensures a secure support of the spherical container 9 at the rotation center. As a result, the isotropy of crystal growth improves more.

Further, the spherical container 9 is brought into contact with and thereby is supported by the supports 33 in the present embodiment. Therefore, it is not necessary to couple the spherical container 9 with other members, which eases support and removal of the spherical container 9. This can shorten preparation time, and thus an effective crystallization operation can be realized. As described above, the present embodiment is extremely practical.

As described above, it is possible to form a spherical container in one piece by supporting the spherical container 9. This can prevent the solution from leakage. Meanwhile, joined structure of the flanges 25 and 26 of the coolant cover 21 prevents the cooling medium from leakage.

Third Embodiment

Configuration

A configuration of a third embodiment will be described below. The second embodiment has a problem of possible occurrence of cooling suppression with the passage of time due to the heat equilibrium of the cooling medium. The third embodiment differs from the second embodiment in that the cooling medium is circulated in the third embodiment. More specifically, a crystallizer according to the third embodiment includes a cooling medium conduit 40.

Figure 7:
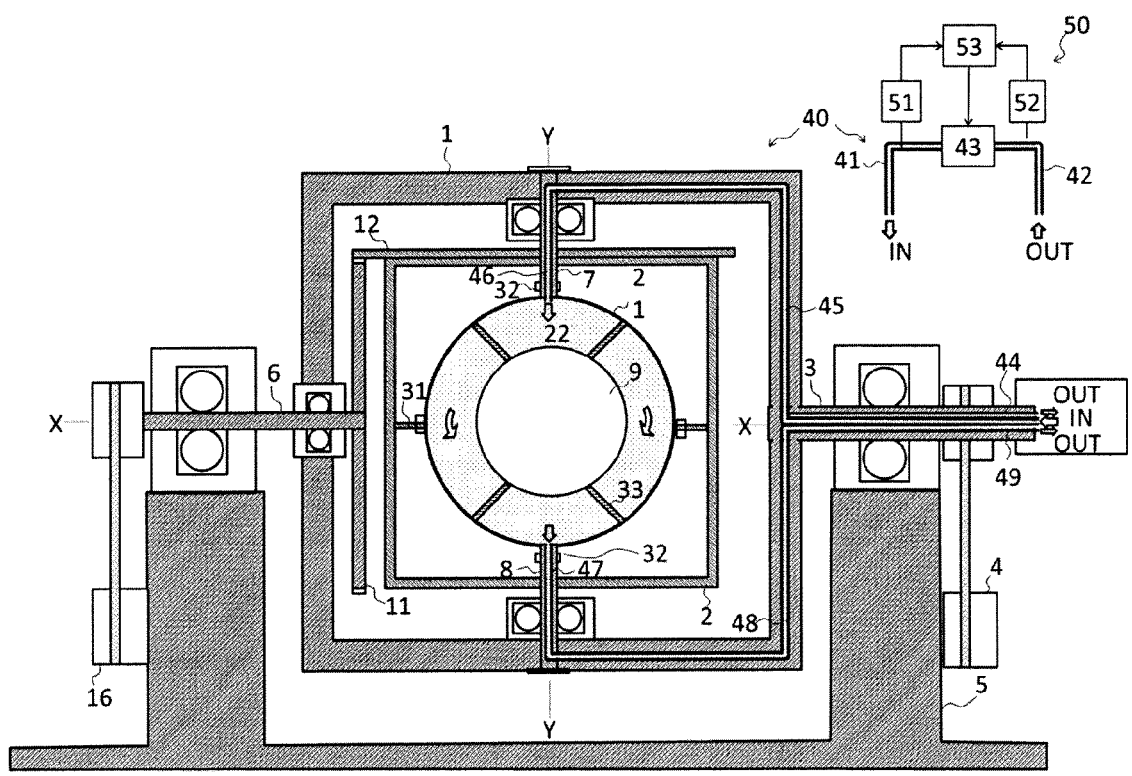
FIG. 7 schematically illustrates a configuration of a crystallizer according to a third embodiment.

FIG. 7 schematically illustrates a configuration of the crystallizer. For the sake of easy understanding of the cooling medium conduit 40, a cross section of the crystallizer is illustrated. Components omitted from FIG. 1 are also illustrated here.

For example, the driving force of the electric motor 4 is transmitted to the horizontal shaft 3 via a belt. The electric motor 4 is mounted to the fixed frame 5.

An electric motor 16 which causes the horizontal shaft 6 to rotate via a belt is provided on the other side of the electric motor 4. Driving of the electric motor 16 causes the first disc 11 to rotate about the axial center of the horizontal shaft 6 (about the X-X line as the axial center). This rotation is added to the driven rotation of the first embodiment. However, the rotation is not added to the rotation of the first rotation frame. Further, the rotation is converted to the rotation of the second disc 12, etc., about the Y-Y line via the driving force transmission system 10. In other words, rotations of two shafts can be controlled independently one by one.

Meanwhile, in the present embodiment, the driving force generated by the electric motor 16 is ignored for the sake of simple description.

Further, the crystallizer of the present embodiment includes the cooling medium conduit 40 within the turning gear. The cooling medium conduit 40 is composed of a supply conduit 41 and a discharge conduit 42.

Conduits 44 and 49 are formed within the horizontal shaft 3. Conduits 45 and 48 are formed within the first rotation frame 1. A conduit 46 is formed within the vertical shaft 7. A conduit 47 is formed within the vertical shaft 8. The conduits 44 and 49 are formed into a double tube structure. That is, the conduit (outer tube) 49 covers around the conduit (inner tube) 44.

The supply conduit 41 guides a cooling medium into the coolant cover 21 from an external heat medium supply unit (supplying unit of external heating medium) 43 via the conduit 44 within the horizontal shaft 3, the conduit 45 within the first rotation frame 1, and the conduit 46 within the vertical shaft 7. The cooling medium supplied into the coolant cover 21 cools the spherical container 9. At the time, heat exchange is performed.

The discharge conduit 42 discharges the cooling medium out of the turning gear from the coolant cover 21 via the conduit 47 within the vertical shaft 8, the conduit 48 within the first rotation flame 1, and the conduit 49 within the horizontal shaft 3. Thus discharged cooling medium is cooled and supplied, again, from the external heat medium supply unit 43.

Further, the crystallizer of the present embodiment includes a temperature control system 50. A temperature sensor 51 is provided at an inlet side of the supply conduit 41. A temperature sensor 52 is provided at an outlet side of the discharge conduit 42.

A temperature control unit 53 receives temperature data of the temperature sensors 51 and 52 and, based on the received data, estimates a temperature of the inside of the spherical container 9 taking, for example, heat balance into consideration. Then, the temperature control unit 53 outputs thus estimated result to the external heat medium supply unit 43. The external heat medium supply unit 43 controls the temperature of the cooling medium such that the estimated temperature of the inside of the spherical container 9 becomes a target temperature.

Further, the temperature control unit 53 receives temperature data of the temperature sensor 51 and, based on the received data, confirms whether the temperature of the cooling medium supplied from the external heat medium supply unit 43 is appropriately controlled.

Accordingly, the temperature of the inside of the spherical container 9 can be controlled.

Next, joint 60 of the conduits will be described below. The first rotation frame 1 is coupled to the horizontal shaft 3. Therefore, the conduit 44 and the conduit 45 are continuous and thus do not require the joint. The same is applied to conduit 48 and the conduit 49.

On the other hand, the vertical shaft 7 rotates about the Y-Y line with respect to the first rotation frame 1. Therefore, the cooling medium conduit 40 is secured by using the joint 60.

Figure 8:
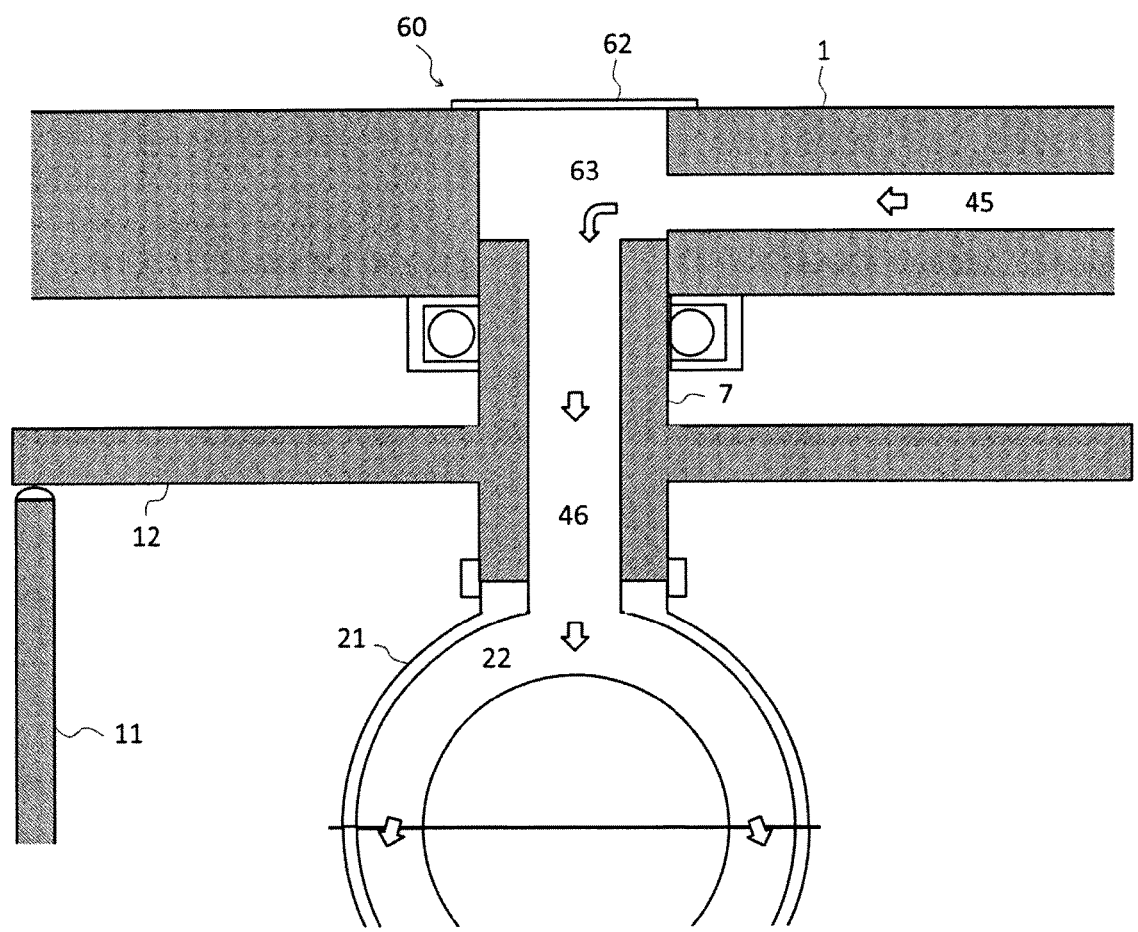
FIG. 8 schematically illustrates a configuration of a joint according to the third embodiment.
Figure 9:
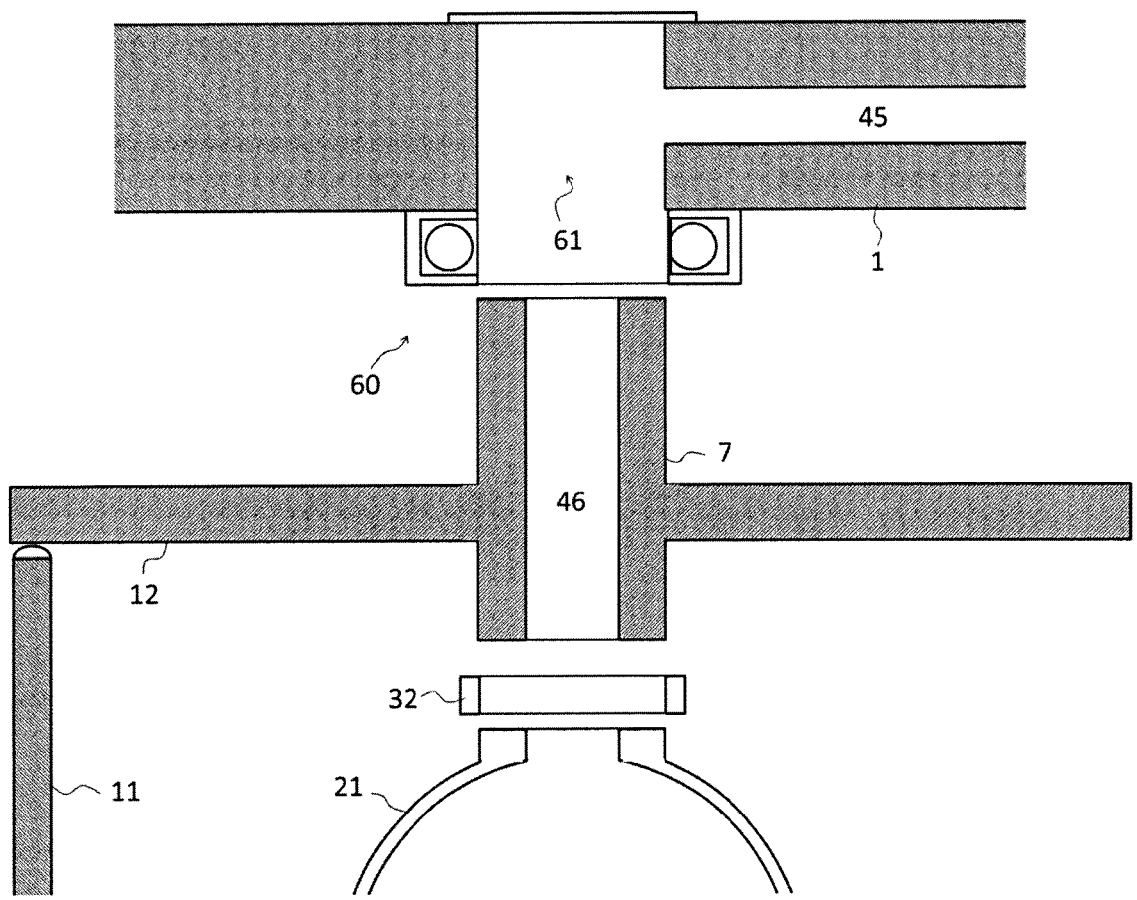
FIG. 9 is a deal drawing of the joint according to the third embodiment.

FIG. 8 schematically illustrates a configuration of the joint. FIG. 9 is a deal drawing illustrating the joint for facilitating understanding of the joint.

An opening 61 is defined in the first rotation frame 1 at a position where the vertical shaft 7 is mounted. However, the opening 61 does not reach a side surface opposite to the vertical shaft 7 but has an end face at the opposite position of the opening 61. In a case where the opening 61 reaches the side surface opposite to the vertical shaft 7, a seal cap 62 is provided on the opposite side surface. This prevents the cooling medium from being leaked to the outside of the first rotation frame 1.

The opening 61 is continuous to the conduit 45 formed within the first rotator 1. Then, an upper end of the vertical shaft 7 is engaged with the opening 61 (see, FIG. 7), thereby forming the joint 60.

At the time, the end face of the vertical shaft 7 does not contact the seal cap 62 (or the opening end side). In other words, a conduit space 63 is secured between the end face of the vertical shaft 7 and the seal cap 62. As a result, in an engaging state of the opening 61 with the end of the vertical shaft 7, the conduit 45 and the conduit space 63 are continuous to each other.

The vertical shaft 7 passes through to the end of the opposite side to form the conduit 46. Accordingly, the conduit 45 and the conduit 46 come to be continuous to each other via the opening 61 (conduit space 63).

Meanwhile, a ball bearing is provided between the vertical shaft 7 and the first rotation frame 1. This ensures smooth rotation of the vertical shaft 7 about the Y-Y line with respect to the first rotation frame 1.

The joint 60 is formed also between the vertical shaft 8 and the first rotation frame 1.

Effect

The crystallizer of the present embodiment includes the cooling medium conduit 40 and thus can continuously supply cooling medium. More specifically, crystallization can be continued without cooling suppression. Further, the joint 60 contributes to secure the cooling medium conduit 40 without obstructing the rotation of the vertical shafts 7 and 8.

The crystallizer of the present embodiment includes the temperature control system 50 and thus can control the temperature of the inside of the spherical container 9.

Figure 10A:
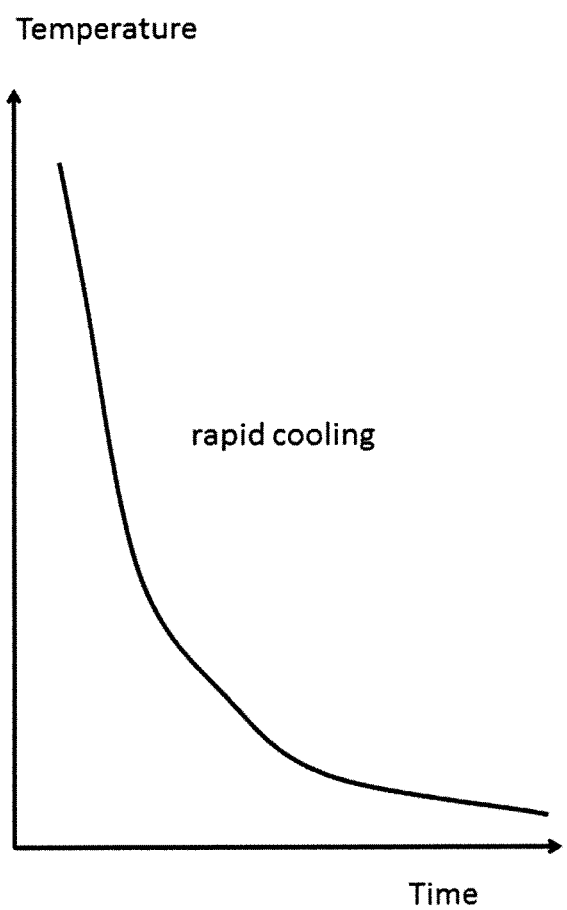
FIG. 10A is graphs illustrating temperature controls (rapid) according to the third embodiment.
Figure 10B:
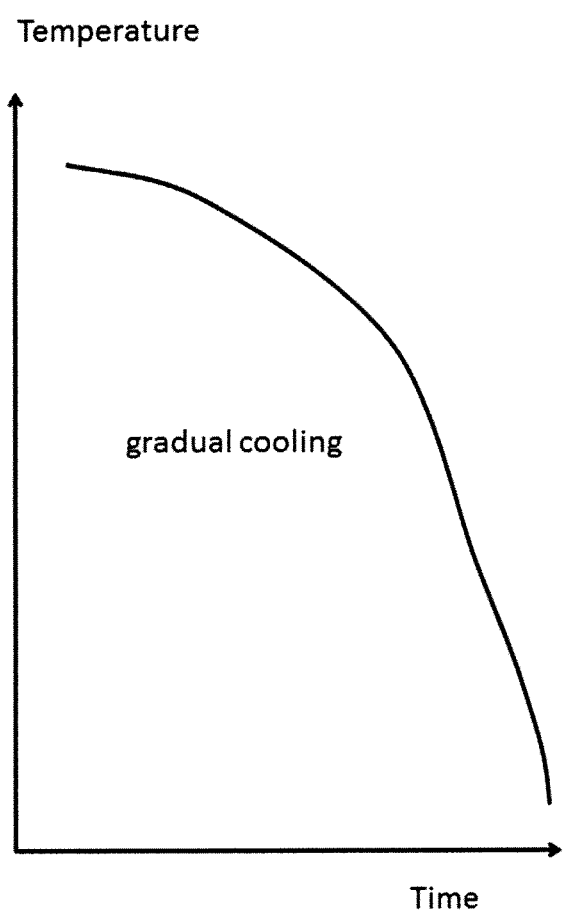
FIG. 10B is graphs illustrating temperature controls (gradual) according to the third embodiment.

Meanwhile, it is known that different crystals are generated in different cooling histories in the crystallization. FIG. 10A is a graph illustrating a temperature history when the cooling is performed rapidly. FIG. 10B is a temperature history when the cooling is performed gradually. According to the present embodiment, various cooling histories can be realized. As a result, it becomes possible to control a grain size of crystals and a grain size distribution of crystals. Therefore, various kinds of crystals can be generated.

For example, rapid cooling and generation thereby of supersaturated state in a short time period may generate numerous fine crystal grains. On the other hand, gradual cooling for a long time may generate large crystal grains.

Application to Recrystallization

A case where the above described crystallizer of the present embodiment was applied to a crystallization operation performed by cooling was described hereinabove. In this case, it is provided that a substance to be crystallized is preliminary dissolved within the solution in the container 9.

The crystallizer of the present embodiment further can be applied to recrystallization. A solvent and crystals in undesirable state (e.g., undesirable in an anisotropic state and/or a state of a heterogeneous crystal grain size) are injected into the spherical container 9. Then, the spherical container 9 is placed to be supported within the range of the turning gear.

The external heat medium supply unit 43 can supply not only cooling medium but also high temperature heating medium (e.g., warm water and warm oil).

The supply conduit 41 guides high temperature heating medium into the coolant cover 21 from the external heat medium supply unit 43 via the conduit 44 within the horizontal shaft 3, the conduit 45 within the first rotation frame 1, and the conduit 46 within the vertical shaft 7. The high temperature heating medium supplied to the coolant cover 21 heats the spherical container 9. At the time, heat exchange is performed. This ensures dissolution of more substances.

The discharge conduit 42 discharges the heating medium out of the turning gear from the coolant cover 21 via the conduit 47 within the vertical shaft 8, the conduit 48 within the first rotation frame 1, and the conduit 49 within the horizontal shaft 3. Thus discharged heating medium is heated and supplied, again, from the external heat medium supply unit 43.

The temperature control system 50 controls the temperature of the inside of the spherical container 9. More specifically, the temperature control system 50 can make the inside of the spherical container 9 at the most appropriate temperature for dissolution. Further, the temperature control system 50 provides three-dimensional rotary motion to a liquid in a suspended state. This ensures extremely rapid dissolution in comparison with the conventional two-dimensional stirring operation.

Figure 11:
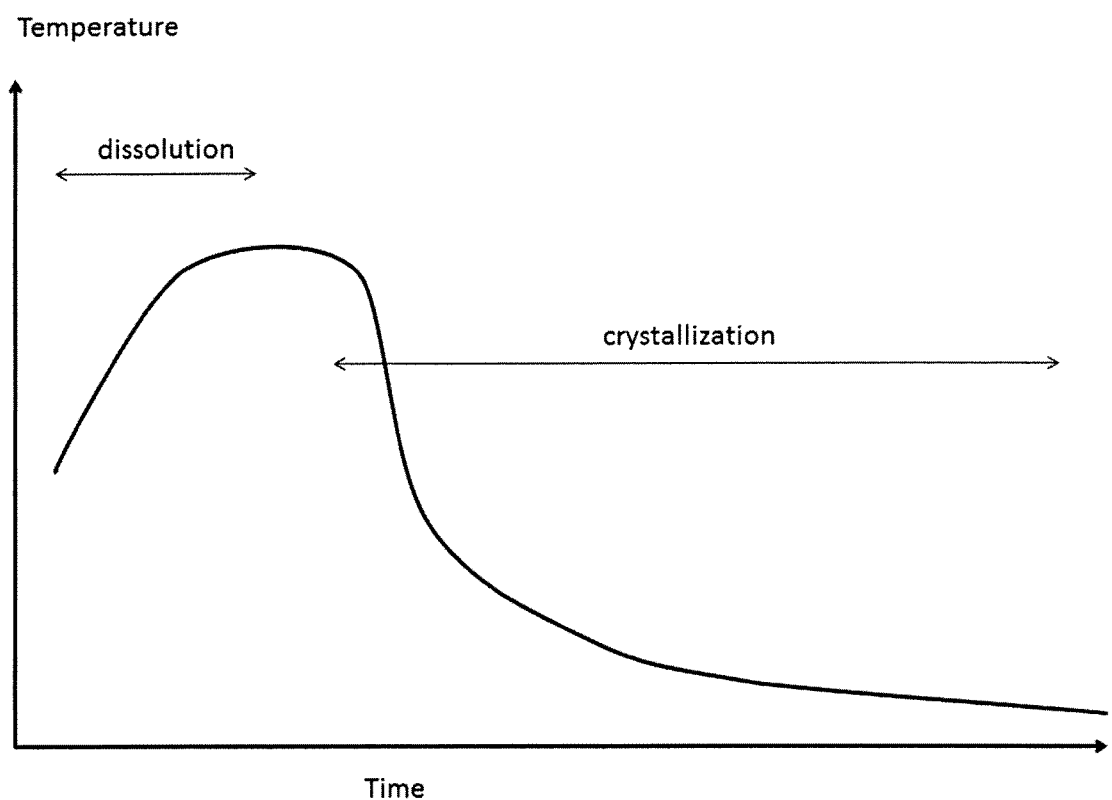
FIG. 11 illustrates a series of temperature history from dissolution at high temperature to crystallization by cooling according to the third embodiment.

After the perfect dissolution, the operation is switched from heating to cooling. Then, crystallization is performed in a manner as described above. As described above, the crystallizer of the present embodiment is also applicable to recrystallization. FIG. 11 illustrates a temperature history of a series of operations.

The turning gear of the present embodiment proves by a test drive that the speed changing operation can be performed within a range of 0 and several hundred rpm. Therefore, it is possible to change the speed at the time of dissolution and at the time of crystallization, respectively.

For example, the speed at the time of dissolution can be faster than the speed at the time of crystallization. To the contrary, the speed at the time of crystallization can be faster than the speed at the time of dissolution.

Programming of a free combination of heating/cooling and a speed control thereof in the crystallization operation and a speed of the three-dimensional rotary motion to be further provided thereto enables a control of a grain diameter, distribution, and a control of shapes of thus obtained crystals.

At the time, it is not necessary to stop rotation of the turning gear. Only with the speed changing operation and the switching operation from heating to cooling, operations from dissolution to crystallization can be performed as a series of operations. More specifically, there is a good operability.

Meanwhile, a series of operations was realized by using the crystallizer according to the third embodiment in the above description. However, in the first embodiment, a similar operation can be realized by a combination of warm air heating at the time of dissolution and cool air cooling at the time of crystallization.

Fourth Embodiment
Configuration

A configuration of a fourth embodiment will be described below. The fourth embodiment differs from the first embodiment in that the second rotation frame 2 is a main component in the first embodiment, whereas the second rotation frame 2 is not essential in the fourth embodiment. Further, there is a slight difference in the driving force transmission system 10.

Figure 12:
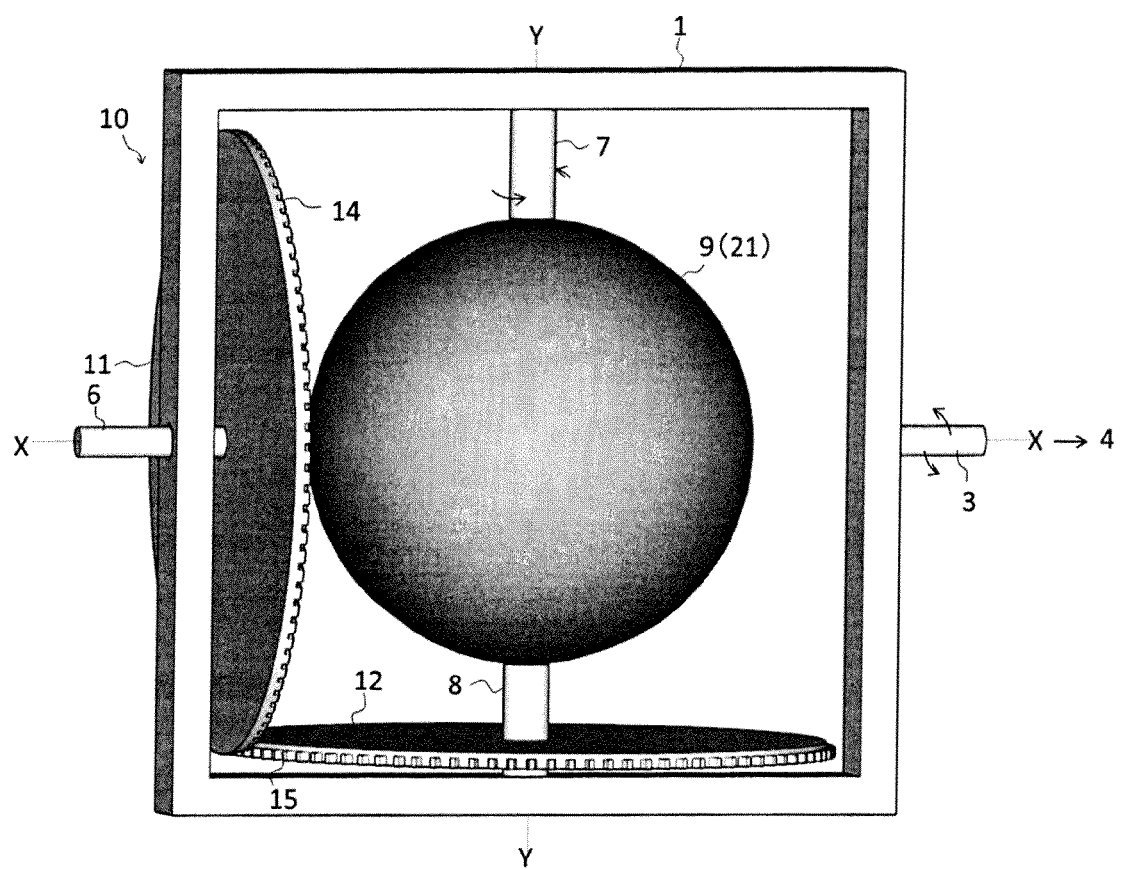
FIG. 12 is a schematic perspective view of a crystallizer according to a fourth embodiment.

FIG. 12 is a schematic perspective view of a crystallizer according to the fourth embodiment. For the sake of easy understanding, only main components are illustrated. Meanwhile, reference is made to FIG. 7 illustrating a similar configuration with respect to the components omitted from FIG. 12.

The crystallizer includes the turning gear. The turning gear rotates the first rotation frame 1.

The first rotation frame 1 is coupled to the horizontal shaft 3. The first rotation frame 1 rotates about the axial center of the horizontal shaft 3 (about the X-X line as the axial center) via the horizontal shaft 3 by a driving force of the electric motor 4.

Meanwhile, the horizontal shaft 6 is provided on the side opposite to the horizontal shaft 3. A ball bearing is provided between the horizontal shaft 6 and the first rotation frame 1. This keeps the horizontal shaft 6 stable even while the first rotation frame 1 rotates.

The shafts oriented to the vertical direction (vertical shafts: second shafts) 7 and 8 are coupled to the first rotation frame 1 at center positions in a right-left and rear-front direction of the first rotation frame 1, respectively, in a manner as illustrated in FIG. 12.

Meanwhile, a ball bearing is provided between each of the vertical shafts 7 and 8 and the first rotation frame 1, respectively. Therefore, even when the vertical shafts 7 and 8 rotates on their axis (about the Y-Y line as the axial center), the turning force therefrom is not transmitted to the first rotation frame 1.

The spherical container 9 is supported via the vertical shafts 7 and 8 in a manner that the center of the spherical container 9 corresponds to the rotation center of the turning gear. The solution to be subjected to the crystallization operation is kept within the spherical container 9.

The turning gear includes the driving force transmission system 10. The driving force transmission system is composed of the first disc 11, the second disc 12, and a gear meshing structure 14, 15.

The first disc 11 is coupled to the horizontal shaft 6, with its disc face being oriented to a direction perpendicular to the horizontal shaft 6. The second disc 12 is coupled to the vertical shaft 8, with its disc face being oriented to a direction perpendicular to the vertical shaft 8. Further, in the present embodiment, the first disc 11 and the second disc 12 are positioned in a manner that the output periphery of the disc face of the first disc 11 contacts the peripheral surface of the second disc 12.

Further, gear teeth 14 are arranged side by side in a line on the peripheral surface of the first disc 11. Gear teeth 15 are arranged side by side in a line on the outer periphery of the disc face of the second disc 12. The peripheral surface of the first disc 11 contacts the second disc 12, at which the gear meshing structure 14, 15 is formed.

Meanwhile, the gear meshing structure 14, 15 is a modification of the contact and transfer structure formed by the elastic body 13 of the first embodiment.

Operation

A driving force of the electric motor 4 causes the first rotation frame 1 to rotate about the X-X line via the horizontal shaft 3.

At the time, since the horizontal shaft 6 on the opposite side of the horizontal shaft 3 is unconnected with the first rotation frame 1, the driving force of the electric motor 4 does not directly work to rotate the first disc 11.

On the other hand, in association with the rotation of the first rotation frame 1, the vertical shafts 7 and 8 provided on the first rotation frame 1 also rotate about the X-X line. Similarly, the second disc 12 rotates about the X-X line via the vertical shafts 7 and 8.

The first disc 11 and the second disc 12 are in contact with each other. Rotation of the second disc 12 about the X-X line indirectly causes the first disc 11 to rotate about the X-X line via the gear meshing structure 14, 15 between the first disc 11 and the second disc 12. In other words, the first disc 11 rotates relative to the first rotation frame 1.

Rotation of the first disc 11 about the X-X line causes the second disc 12 to rotate about the axial center of the vertical shafts 7 and 8 (about the Y-Y line) via the gear meshing structure 14, 15. The vertical shafts 7 and 8 also rotate about the Y-Y line.

More specifically, the vertical shafts 7 and 8 rotate about the axial center of the horizontal shafts 3 and 6 (about the X-X line) as well as rotate on their own axis (about the Y-Y line).

The spherical container 9 is supported on the vertical shafts 7 and 8. The spherical container 9 also rotates about the X-X line as well as rotates about the Y-Y line. Namely, the spherical container 9 performs biaxial rotation (three-dimensional rotation).

When the electric motor 4 is rotated at high speed, a pseudo non-gravity environment appears at around the center of the inside of the spherical container 9.

Effect

In the fourth embodiment, the configuration of the first embodiment is simplified. More specifically, the crystallizer of the fourth embodiment does not require the second rotation frame 2 or the coupling rods 31. This ensures compactification of the crystallizer. Further, reduction of number of components and compactification of the crystallizer lead to cost reduction.

The fourth embodiment includes components almost common to those of the first embodiment (specifically, driving force transmission system 10) and operates similarly. Therefore, the fourth embodiment produces an effect similar to that of the first embodiment.

Exemplary Modification

Further, the cooling unit 20 and the container supporting unit 30 of the second embodiment may be added to the fourth embodiment. This ensures production of an effect similar to that of the second embodiment.

Still further, the cooling medium conduit 40, the temperature control system 50, and the joint 60 of the third embodiment may be added to the fourth embodiment. This ensures production of an effect similar to that of the third embodiment.

REFERENCE CHARACTER LIST 1 first rotation frame
2 second rotation frame
3 horizontal shaft
4 electric motor
5 fixed frame
6 horizontal shaft
7, 8 vertical shaft
9 spherical container
10 driving force transmission system
11 first disc
12 second disc
13 elastic body
14, 15 gear meshing structure
16 second electric motor
20 cooling unit
21 coolant cover
22 heat exchange space
23 upper half-sphere
24 lower half-sphere
25, 26 flange
30 container supporting unit
31 coupling rod
32 coupling
33 support
40 cooling medium conduit
41 supply conduit
42 discharge conduit
43 external heat medium supply unit
44~49 conduit formed within turning gear
50 temperature control system
51, 52 temperature sensor
53 temperature control unit
60 joint
61 opening
62 seal cap
63 conduit space

What is claimed is:

1. A crystallizer comprising:
a turning gear comprising,
first shafts,
a first rotator coupled to the first shafts,
a drive unit rotating the first rotator about an axial center of the first shafts,
second shafts provided on the first rotator, the second shafts having an axial center oriented to a direction perpendicular to the direction of the axial center of the first shafts,
a second rotator coupled to the second shafts, and
a driving force transmission system comprising,
a first disc rotating about the axial center of the first shafts relative to the first rotator, the first disc having its disc face oriented to a direction perpendicular to the first shafts, and
a second disc coupled to one of the second shafts, the second disc having its disc face oriented to a direction perpendicular to the second shafts, wherein a contact between the first disc and the second disc transmits a turning force of the first rotator which is rotated by the drive unit to cause the second rotator to rotate about the axial center of the second shafts;
a spherical container; and
a container supporting unit supporting the spherical container within the second rotator in a manner that a rotation center of the turning gear which is composed of the axial center of the first shafts and the axial center of the second shafts corresponds to a center of the spherical container.

2. The crystallizer according to claim 1, further comprising:
a heat exchange unit covered by a spherical heat medium cover and causing a temperature of the spherical container to change by using heating medium covering the spherical container.

3. The crystallizer according to claim 2, wherein the container supporting unit supports the spherical container via the heat medium cover.

4. The crystallizer according to claim 2, wherein the heat exchange unit comprises a heating medium channel which guides heating medium into the heat medium cover from an external heat medium supply unit via conduits provided within one of the first shafts, the first rotator, and one of the second shafts.

5. The crystallizer according to claim 4, further comprising:
a temperature control unit
estimating a temperature of the inside of the spherical container based on a supply side temperature and a discharge side temperature of the heating medium channel and
controlling a temperature of heating medium supplied from the external heat medium supply unit in a manner that the estimated temperature becomes a predetermined temperature.

6. The crystallizer according to claim 4, further comprising:
a joint comprising,
openings defined in the first rotator at positions where the second shafts are mounted;
wherein each opening is continuous to the corresponding conduit provided within the first rotator; and
wherein the joint is formed by engagement of the openings with the second shafts.

7. The crystallizer according to claim 2, wherein the heat exchange unit is switchable between cooling and heating.

8. A method of crystallization performed by using the crystallizer according to claim 1, comprising:
rotating the spherical container by means of the turning gear;

heating the spherical container at the time of dissolution to a solution;

switching from heating to cooling; and cooling the spherical container at the time of crystallization of the solution.

9. A crystallizer comprising:

a turning gear comprising,
  first shafts,
  a first rotator coupled to the first shafts,
  a drive unit rotating the first rotator about an axial center of the first shafts,
  second shafts provided on the first rotator, the second shafts having an axial center oriented to a direction perpendicular to a direction of the axial center of the first shafts, and
  a driving force transmission system comprising,
    a first disc rotating about the axial center of the first shafts relative to the first rotator, the first disc having its disc face oriented to a direction perpendicular to the first shafts, and
    a second disc coupled to one of the second shafts, the second disc having its disc face oriented to a direction perpendicular to the second shafts, wherein a contact between the first disc and the second disc transmits a turning force of the first rotator which is rotated by the drive unit to cause the second shafts to rotate about the axial center of the second shafts;

a spherical container; and a container supporting unit supporting the spherical container on the axial center of the second shafts in a manner that a rotation center of the turning gear which is composed of the axial center of the first shafts and the axial center of the second shafts corresponds to a center of the spherical container.

10. The crystallizer according to claim 9, further comprising:

a heat exchange unit covered by a spherical heat medium cover and causing a temperature of the spherical container to change by using heating medium covering the spherical container.

11. The crystallizer according to claim 10, wherein the container supporting unit supports the spherical container via the heat medium cover.

12. The crystallizer according to claim 10, wherein the heat exchange unit comprises a heating medium channel which guides heating medium into the heat medium cover from an external heat medium supply unit via conduits provided within one of the first shafts, the first rotator, and one of the second shafts.

13. The crystallizer according to claim 12, further comprising:

a temperature control unit
  estimating a temperature of the inside of the spherical container based on a supply side temperature and a discharge side temperature of the heating medium channel and
  controlling a temperature of heating medium supplied from the external heat medium supply unit in a manner that the estimated temperature becomes a predetermined temperature.

14. The crystallizer according to claim 12, further comprising:

a joint comprising,
  openings defined in the first rotator at positions where the second shafts are mounted;
    wherein each opening is continuous to the corresponding conduit provided within the first rotator; and
  wherein the joint is formed by engagement of the openings with the second shafts.

15. The crystallizer according to claim 10, wherein the heat exchange unit is switchable between cooling and heating.

16. A method of crystallization performed by using the crystallizer according to claim 9, comprising:

rotating the spherical container by means of the turning gear;

heating the spherical container at the time of dissolution to a solution;

switching from heating to cooling; and cooling the spherical container at the time of crystallization of the solution.

* * * * *